(12) United States Patent
Gallegos et al.

(10) Patent No.: US 9,041,208 B2
(45) Date of Patent: May 26, 2015

(54) LAMINATE INTERCONNECT HAVING A COAXIAL VIA STRUCTURE

(75) Inventors: Adam Gallegos, Fort Collins, CO (US); Mark Hinton, Fort Collins, CO (US); Nurwati Suwendi Devnani, Fort Collins, CO (US); John Connor, Colorado Springs, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 323 days.

(21) Appl. No.: 13/287,194

(22) Filed: Nov. 2, 2011

(65) Prior Publication Data

US 2013/0105987 A1    May 2, 2013

(51) Int. Cl.
| | |
|---|---|
| *H01L 23/498* | (2006.01) |
| *H05K 1/02* | (2006.01) |
| *H01L 21/48* | (2006.01) |
| *H05K 3/46* | (2006.01) |
| *H01L 23/00* | (2006.01) |

(52) U.S. Cl.
CPC . *H01L 23/49827* (2013.01); *H01L 2224/73253* (2013.01); *H01L 2924/15311* (2013.01); *H05K 1/0222* (2013.01); *H05K 1/0245* (2013.01); *H05K 3/4602* (2013.01); *H05K 2201/09809* (2013.01); *H01L 23/49816* (2013.01); *H01L 21/486* (2013.01); *H01L 24/16* (2013.01); *H01L 2224/16235* (2013.01); *H01L 2224/29099* (2013.01); *H01L 2224/131* (2013.01); *H01L 2224/32245* (2013.01)

(58) Field of Classification Search
CPC .................................. H01L 23/49827
USPC ......................... 257/774, E23.145
See application file for complete search history.

(56) References Cited

U.S. PATENT DOCUMENTS

| | | | |
|---|---|---|---|
| 5,293,502 A | 3/1994 | Kimura et al. | |
| 6,542,065 B2 * | 4/2003 | Shrier et al. | 338/21 |
| 7,778,038 B2 | 8/2010 | McGregor et al. | |
| 2010/0164062 A1 * | 7/2010 | Wang et al. | 257/532 |

FOREIGN PATENT DOCUMENTS

| | | |
|---|---|---|
| CN | 201465645 U | 5/2010 |
| JP | 62206860 A | 9/1987 |

* cited by examiner

*Primary Examiner* — Amar Movva

(57) ABSTRACT

A laminate interconnect structure includes a core material and at least one additional layer adjacent the core material, a first electrically conductive via formed in the core material, and a second electrically conductive via formed in the core material, coaxial with the first electrically conductive via and separated from the first electrically conductive via by a non-conductive material.

20 Claims, 8 Drawing Sheets

US 9,041,208 B2

LAMINATE INTERCONNECT HAVING A COAXIAL VIA STRUCTURE

BACKGROUND

A modern application specific integrated circuit (ASIC) must meet very stringent design and performance specifications. One of the factors that influence the design and performance of an ASIC is inductance. Typically, it is desirable to minimize the inductance in the power supply network as well as in the signal distribution network. Minimizing inductance improves signal isolation and reduces cross talk between signal paths. A modern ASIC is typically assembled into a package, which is then mounted to a structure, such as a printed circuit board, using one of a number of known mounting techniques. The ASIC package frequently includes a laminate structure that includes a laminate core and one or more material layers on opposing sides of the core that include conductive traces and that are used to distribute power, to route signals and to provide ground connections for both power and signal connections. The laminate structure is typically located between the ASIC chip and the PCB to distribute power and signals between the ASIC and the PCB. Due to the many power and signal connections in a modern ASIC, inductance between power supply and ground connections, and inductance between signal and ground connections and between signal lines can easily become so large that it negatively affects the performance of the ASIC.

Therefore, it would be desirable to have a way of minimizing power supply inductance and signal inductance in an ASIC.

SUMMARY

In an embodiment, a laminate interconnect structure includes a core material and at least one additional layer adjacent the core material, a first electrically conductive via formed in the core material, and a second electrically conductive via formed in the core material, coaxial with the first electrically conductive via and separated from the first electrically conductive via by a non-conductive material.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

A laminate interconnect having a coaxial via structure can be used in any application specific integrated circuit (ASIC) in which it is desirable to reduce loop inductance between power and ground connections, reduce loop inductance between signal and ground connections, and reduce inductive coupling between signal connections. Minimizing inductance and inductive coupling improves signal isolation and reduces cross talk between signal paths. The laminate interconnect having a coaxial via structure can be implemented in circuits having single-ended signals, or in circuits having differential signals. The laminate interconnect having a coaxial via structure will be described below as being implemented in an ASIC package. However, the laminate interconnect having a coaxial via structure can be implemented in any laminate structure such as a printed circuit (PC) board interconnect.

Figure 1:
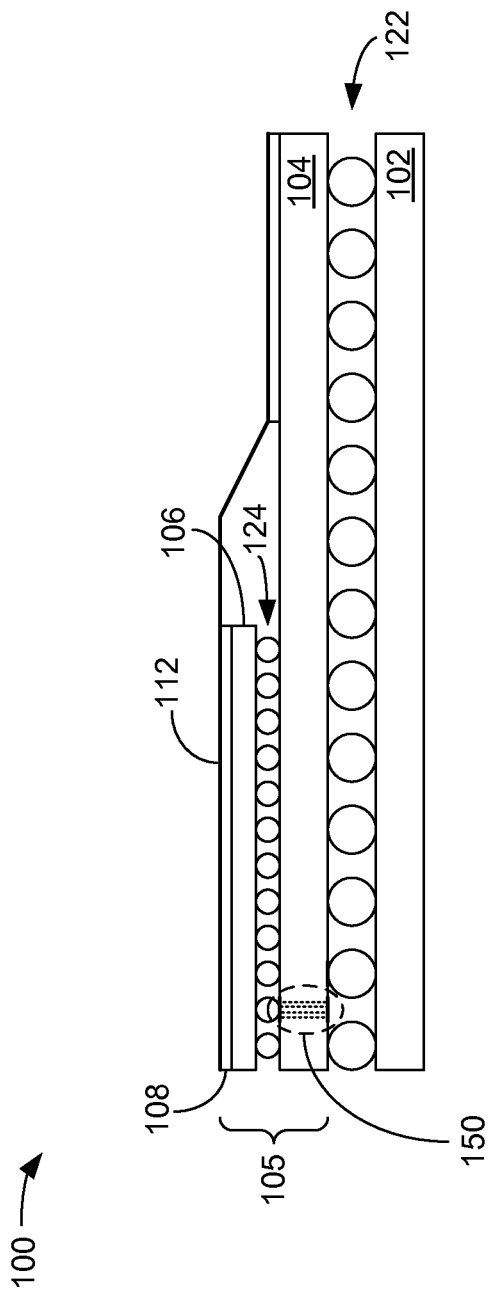
FIG. 1 is a schematic diagram illustrating a portion of an application specific integrated circuit (ASIC) assembly including a laminate structure having one or more coaxial via structures.

FIG. 1 is a schematic diagram illustrating a portion of an application specific integrated circuit (ASIC) assembly 100 including a laminate structure having one or more coaxial via structures. The assembly 100 comprises a printed circuit (PC) board 102 over which a circuit package 105 is located and attached to the PC board 102 using solder balls 122. An example of a circuit package 105 can be a DRAM package or another circuit package. Further, the circuit package 105 can be a flip-chip package, or another circuit package as known to those skilled in the art. The PC board 102 can be any single-layer or multi-layer structure used to mount a circuit package, such as the circuit package 105 as known in the art. The solder balls 122 are an example of an attachment structure that can be used to electrically and mechanically attach the circuit package 105 to the PC board 102, and are known to those skilled in the art.

The circuit package 105 comprises a circuit element, also referred to as a "chip" 106 located and attached to a laminate structure 104 using solder bumps 124. The chip 106 generally comprises the active circuit elements of the ASIC circuitry. The solder bumps 124 are an example of an attachment structure that can be used to electrically and mechanically attach the chip 106 to the laminate structure 104, and are known to those skilled in the art. A lid 112 is attached to the circuit package 105 using an adhesive 108 as known to those skilled in the art.

The laminate structure 104 generally comprises a laminate core and one or more layers formed on one or both sides of the laminate core. The laminate core and the layers formed thereon will be shown in greater detail below. The laminate structure 104 generally comprises a power distribution network and signal distribution connections, sometimes referred to as circuit traces, which transfer power and signal connections between the PC board 102 and the chip 106. Generally, the form factor and the array of solder bumps 124 of the chip 106 dictate that connection to the PC board 102 and the array of solder balls 122 occur through an adaptive connection. The laminate structure 104 serves this adaptive connection function of coupling the chip 106 to the PC board 102, and distributing the connections between the chip 106 and the PC board 102. The laminate structure 104 generally comprises one or more power layers, ground plane layers, and wiring interconnects. The laminate structure 104 may also include one or more passages, referred to as "vias" that provide electrical connectivity between and among the various layers of the laminate structure 104. In an embodiment, the laminate structure 104 may include a coaxial via structure, an example one of which is illustrated using reference numeral 150. The coaxial via structure 150 will be described in greater detail below.

In the embodiment shown, the chip 106 is located over the laminate structure 104 and a periphery of the chip 106 is generally contained within the periphery of the laminate structure 104. Further, the laminate structure 104 is located over the PC board 102, and a periphery of the laminate structure 104 is generally contained within a periphery of the PC board 102.

Figure 2:
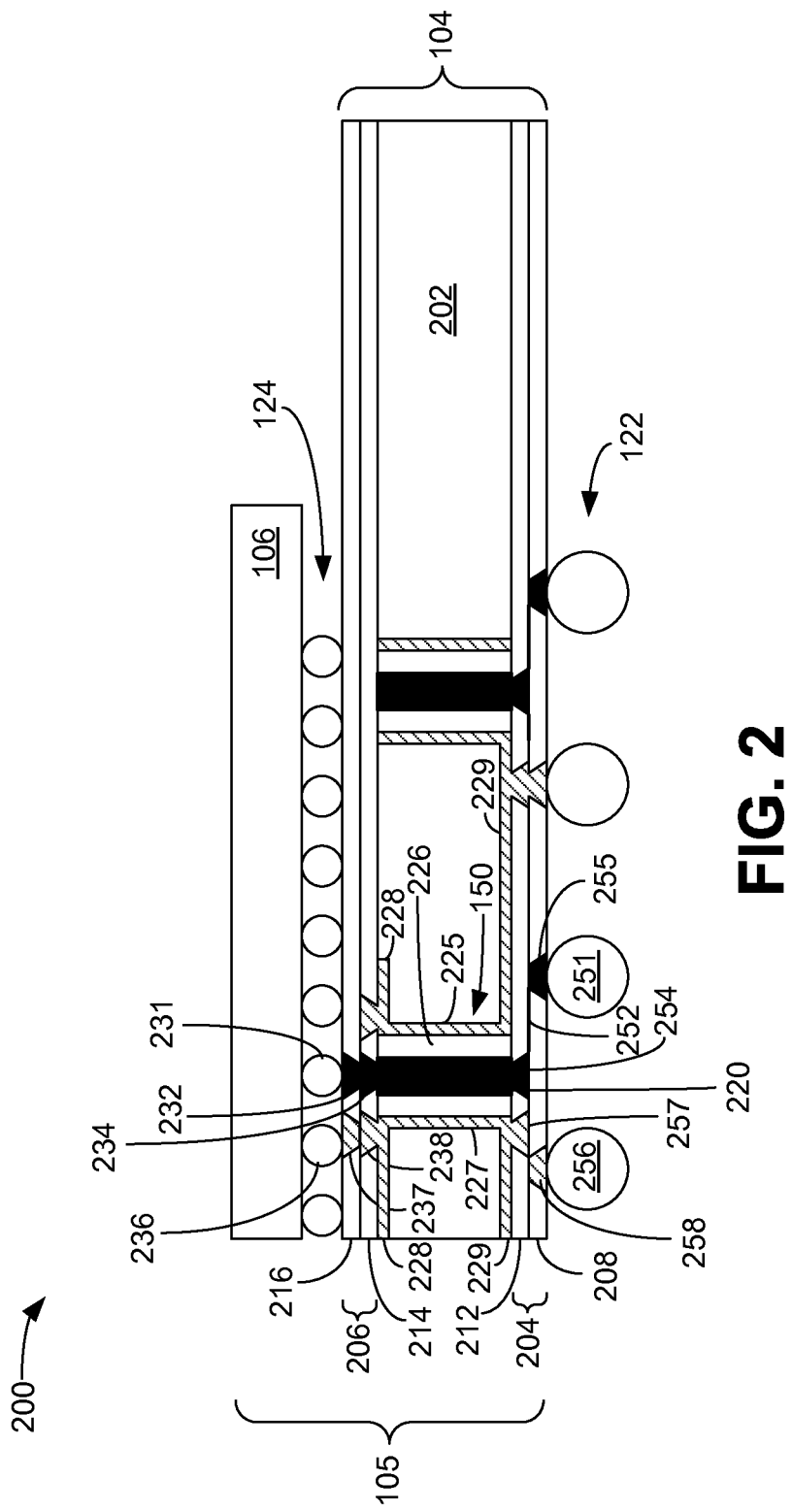
FIG. 2 is a schematic diagram illustrating a portion of the assembly of FIG. 1.

FIG. 2 is a schematic diagram illustrating a portion 200 of the assembly of FIG. 1. The portion 200 generally comprises portions of the circuit package 105, chip 106 and laminate structure 104.

The laminate structure 104 generally comprises a laminate core 202 and layers 204 and 206. For example purposes only, the laminate core 202 can be fabricated from a glass fiber material, or another suitable material known to those skilled in the art. For example purposes only, the layers 204 comprise individual layers 208 and 212, and the layers 206 comprise individual layers 214 and 216. The layers 204 and 206 are illustrated as each comprising two layers, sometimes referred to as "build-up" layers, but those skilled in the art will recognize that layers 204 and 206 may comprise more or fewer layers, and may each comprise a different number of layers. The layers 204 and 206 generally include a combination of non-conductive high density build-up material and material used to construct electrical interconnects including, but not limited to, copper, or other conductive material circuit traces, or other conductive material circuit pads, and other conductive elements and structures.

The laminate structure 104 also comprises an embodiment of a coaxial via structure 150. In the embodiment shown, the coaxial via structure 150 comprises a central via 220 and a peripheral via 225, which in this embodiment, can be constructed as a through hole electrically conductive plated via or an electrically conductive filled via. In the example shown in FIG. 2, the peripheral via 225 is constructed as a through hole electrically conductive plated via, whereby the peripheral via 225 comprises a vertical portion 227 and layer portions 228 and 229, each of which is formed by plating, or another process by which electrically conductive material is applied or formed. The coaxial via structure 150 also comprises non-conductive fill material 226, which can be, for example purposes only, a non-conductive resin or another structurally stable non-conductive dielectric material.

In the embodiment shown in FIG. 2, the coaxial via structure 150 electrically connects the solder bump 231 to the central via 220, through the conductive elements 232 and 234, and electrically connects the solder bump 236 to the peripheral via 225, through the conductive elements 237 and 238. On the opposing side of the laminate structure 104, the coaxial via structure 150 electrically connects the solder ball 251 to the central via 220, through conductive elements 252, 254 and 255, and electrically connects the solder ball 256 to the peripheral via 225, through the conductive elements 257 and 258. The conductive elements 232, 234, 237 and 238 are formed in the laminate layers 206, as known in the art. Similarly, the conductive elements 252, 254, 255, 257 and 258 are formed in the laminate layers 204, as known in the art. In this manner, a coaxial via structure 150 provides two electrical paths of connectivity between the chip 106 and the PC board 102 (not shown in FIG. 2), while minimizing inductance and while minimizing the amount of area consumed on the laminate structure 104. This arrangement improves signal isolation and minimizes the likelihood of cross talk for signals carried through the coaxial via 150.

Figure 3:
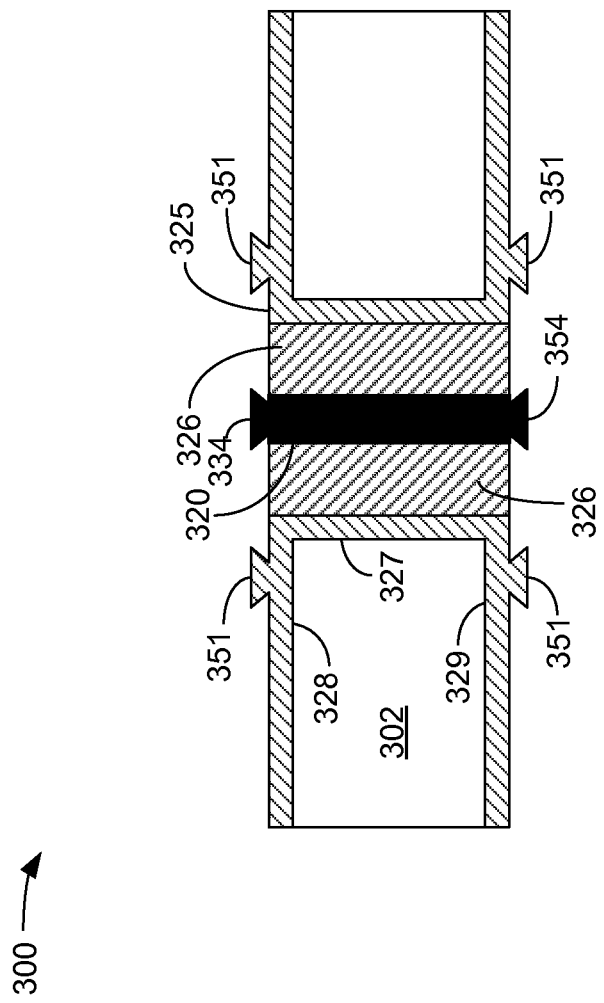
FIG. 3 is a schematic view illustrating a cross-section the coaxial via of FIG. 2.

FIG. 3 is a schematic view illustrating a cross-section of an example coaxial via 300, which is similar to the coaxial via 150 of FIG. 2. The elements in FIG. 3 and in the subsequent figures to follow are numbered using the convention XX, where "XX" refers to a similar element in FIG. 2.

A coaxial via 300 is formed in a laminate core 302. The coaxial via 300 comprises a peripheral via 325 and a central via 320. The peripheral via 325 is formed from a conductive material and comprises a vertical portion 327 and layer portions 328 and 329. In an embodiment, the peripheral via 325 is formed by drilling, etching, boring, or otherwise forming a hole in the laminate core 302 and then plating or otherwise covering the exposed surface of the laminate core 302 with a conductive material to form the vertical portion 327 and the layer portions 328 and 329. Subsequently, conductive elements 351 are formed as generally indicated, but are generally not part of the peripheral via 325.

A non-conductive fill material 326, such as a glass fiber resin or other suitable non-conductive material fills the space within the interior portion of the peripheral via 325. The fill material 326 is then drilled, etched, bored, or otherwise processed to form an opening within which to form the central via 320. The central via 320 can be a plated or filled via, depending upon application. The conductive elements 354 and 334 are formed subsequently as described above in the laminate layers 204 and 206 (not shown in FIG. 3), as described with respect to FIG. 2.

Figure 4A:
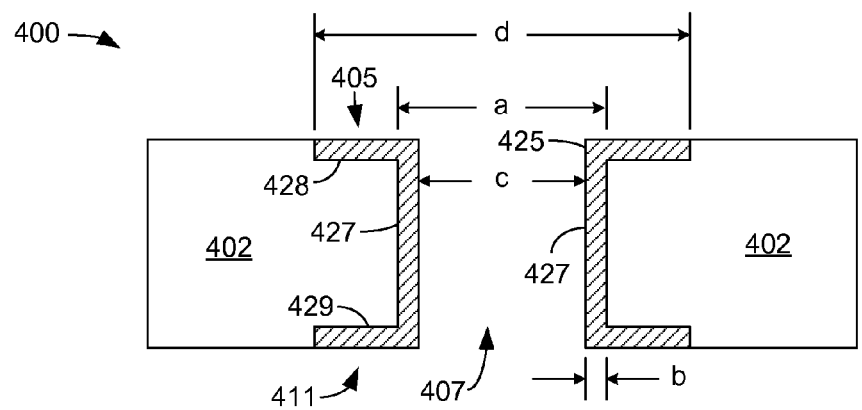
FIGS. 4A through 4D are a series of schematic drawings showing an example of a process or method that can be used to form a coaxial via in a laminate structure.

FIGS. 4A through 4D are a series of schematic drawings showing an example of a process or method that can be used to form a coaxial via in a laminate structure. FIG. 4A shows a schematic diagram 400 including a laminate core 402 having an opening 407 formed therein. The opening 407 can be formed by drilling, boring, etching, eroding, or another known process for creating an opening in a laminate core. In an embodiment, the opening 407 has an initial diameter "a." The diameter "a" as sometimes referred to as the "drill diameter." The peripheral via 425 is formed by plating, or otherwise applying a conductive material to the portions of the laminate core 402 exposed when forming the opening 407. The conductive material forms the vertical portion 427 and the layer portions 428 and 429 of the peripheral via 425. A circuit pad 405 is also formed by portions of the vertical portion 427 and the layer portion 428. The dimension "d" refers to a diameter of the circuit pad to 405. A circuit pad 411 can be similarly formed on the opposing side of the laminate core 402 and may have a dimension that is the same or different than the dimension "d." In the embodiment shown in FIG. 4A, the thickness of the vertical portion 427 is illustrated using dimension "b" and the width of the opening after plating is shown by dimension "c." The thickness of the layer portions 428 and 429 can be the same or different than the dimension "b."

Figure 4B:
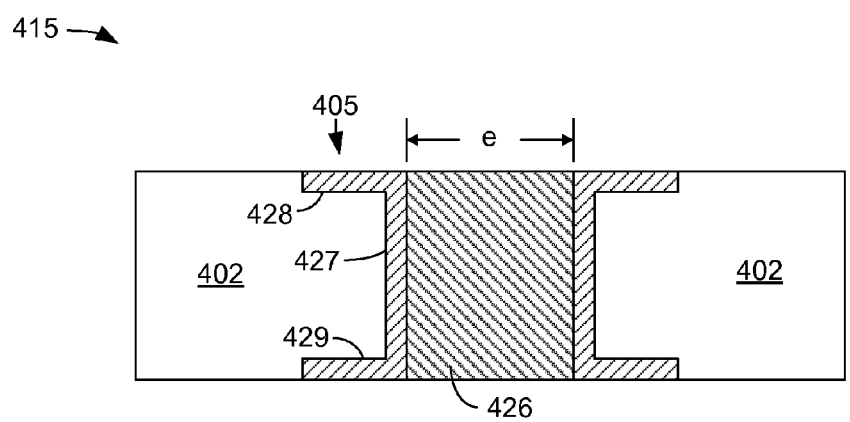

FIG. 4B is a schematic diagram 415 illustrating the peripheral via 425 after being filled with a non-conductive material 426. In an embodiment, the non-conductive material 426 can be a glass resin or other structurally sound material. The dimension "e" refers to the diameter of the resin film material 426.

Figure 4C:
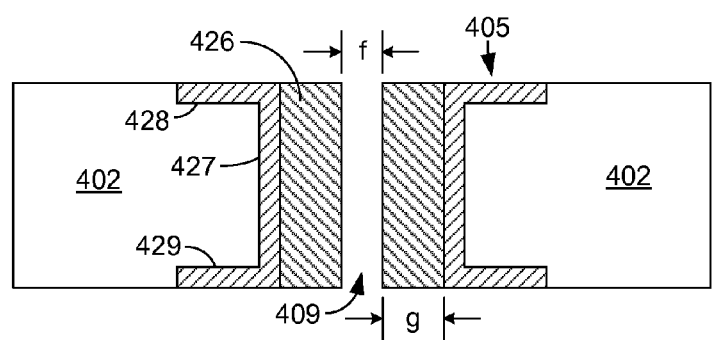

FIG. 4C is a schematic diagram 430 illustrating the formation of an opening 409 through the fill material 426. The diameter of the opening 409 corresponds to dimension "f" and allows for the formation of the central via therein. The dimension "g" refers to the thickness of the resin material 426 on either side of the opening 409.

Figure 4D:
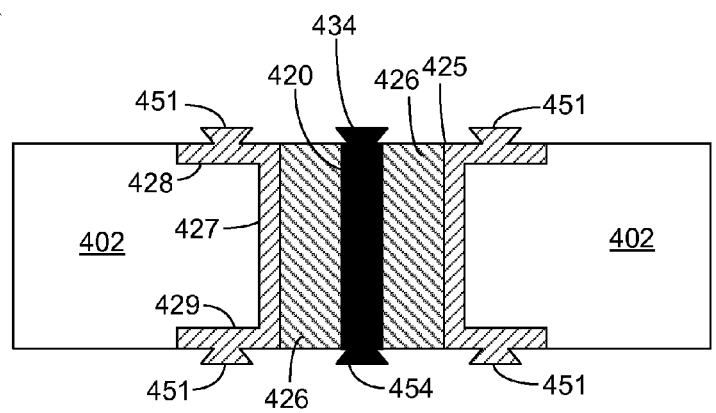

FIG. 4D is a schematic diagram 435 showing a central via 420 formed within the opening 409. The central via 420 can be a solid filled conductive structure, or can be a cylindrical plated hole, so long as the central via 420 is formed using a conductive material. Conductive elements 451 are formed as described above on the pads 405 and 411 of the peripheral via 425 while conductive elements 434 and 454 are formed on opposing ends of the central via 420.

Figure 5:
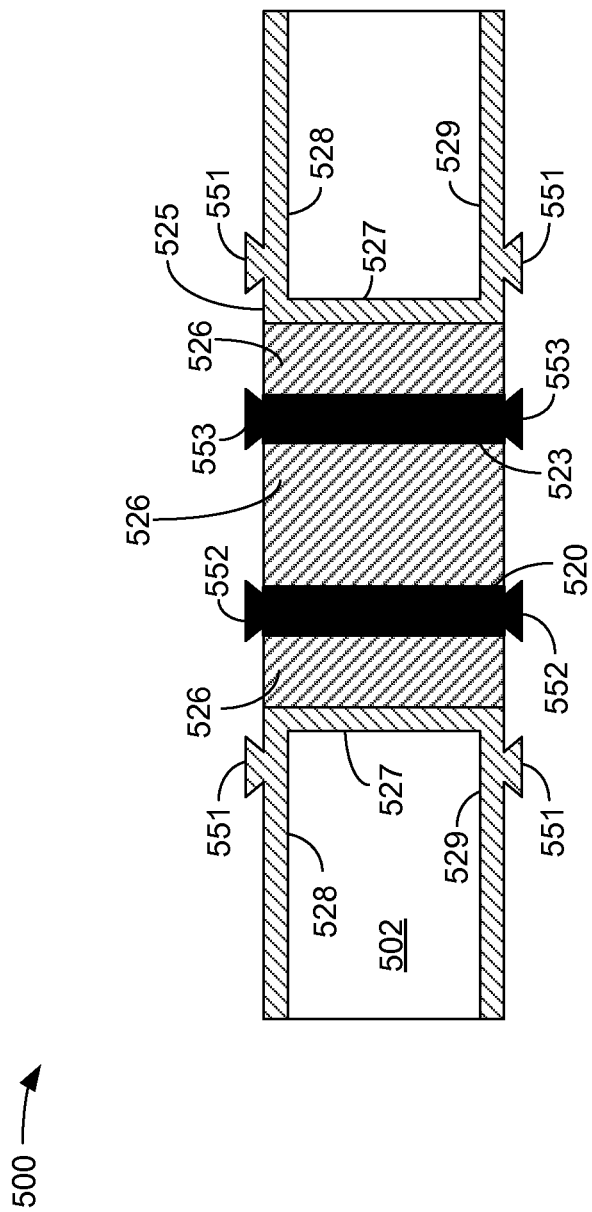
FIG. 5 is a schematic diagram illustrating an alternative embodiment of a coaxial via structure.

FIG. 5 is a schematic diagram 500 illustrating an alternative embodiment of a coaxial via structure. The coaxial via structure shown in FIG. 3 is generally suitable for power and ground connections and for circuit paths having what is referred to as a "single-ended" signal conductor and a single ground path (or power path). The coaxial via structure shown in FIG. 5 is suitable for circumstances in which there may be multiple signal paths and a single ground path, or in applications referred to as a "differential-signal." For example, the coaxial via structure shown in FIG. 5 is suitable for a differential signal path where two signals of opposing polarity and a ground plane (or power plane) are carried.

FIG. 5 illustrates a laminate core 502 within which a peripheral via 525 is formed as described above. The peripheral via 525 is one of three vias shown in FIG. 5. A fill material 526 is used to create a non-conductive solid structure within the peripheral via 525. In the embodiment shown in FIG. 5, two central vias 520 and 523 are formed in and electrically isolated from each other and from the peripheral via 525 by the fill material 526 as described above.

Conductive elements 551 are formed in contact with the peripheral via 525, conductive elements 552 are formed in contact with the central via 520, and conductive elements 553 are formed in contact to the central via 523, as described above. The embodiment shown in FIG. 5 can be used for differential signals in which the opposing polarity signals are carried by the central vias 520 and 523 and a ground connection is carried by the peripheral via 525.

Figure 6:
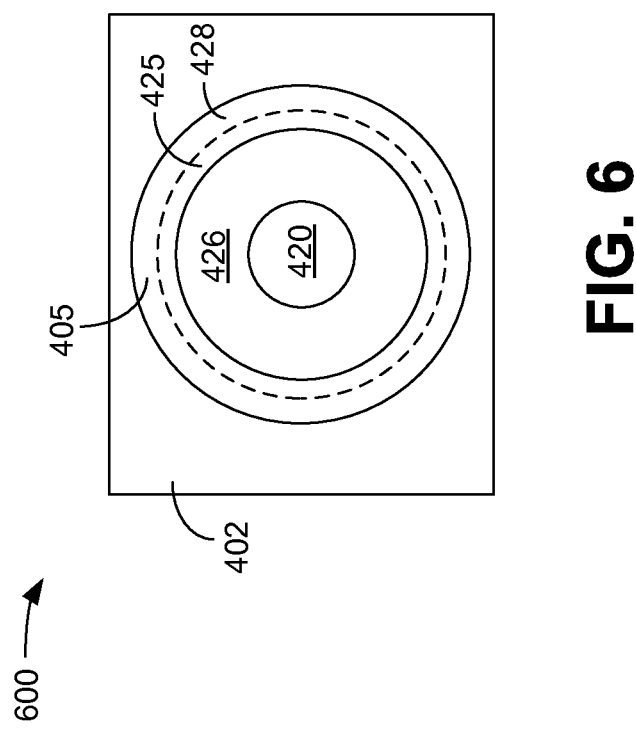
FIG. 6 is a plan view illustrating the coaxial via shown in FIG. 4.

FIG. 6 is a plan view 600 illustrating the coaxial via shown in FIG. 4. The central via 420 is located in the approximate center of the fill material 426. The peripheral via 425 surrounds the fill material 426 and the central via 420. The pad 405 is shown as comprising portions of the peripheral via 425 and layer portion 428, but typically, the material that forms the pad 405 and the peripheral via 425 is a single continuous material. The laminate core 402 is shown for reference.

Figure 7:
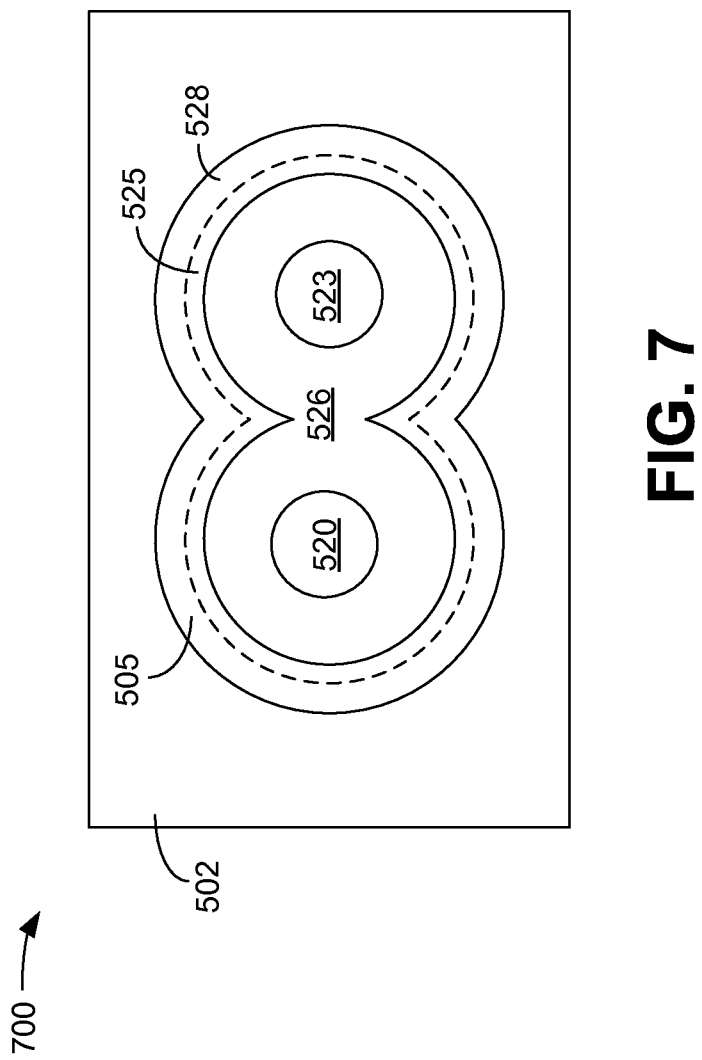
FIG. 7 is a plan view illustrating the coaxial via shown in FIG. 5.

FIG. 7 is a plan view 700 illustrating the coaxial via shown in FIG. 5. The central via 520 and central via 523 are located approximately as shown within and electrically isolated from each other and from the peripheral via 525 by the fill material 526. The peripheral via 525 surrounds the fill material 526 and the central vias 520 and 523. A pad 505 is shown as comprising portions of the peripheral via 525 and layer portion 528, but typically, the material that forms the pad 505 and the peripheral via 525 is a single continuous material. The laminate core 502 is shown for reference.

This disclosure describes the invention in detail using illustrative embodiments. However, it is to be understood that the invention defined by the appended claims is not limited to the precise embodiments described.

What is claimed is:

1. A laminate interconnect structure, comprising:
   a core material with a top outer surface and a bottom outer surface and at least one additional layer adjacent the core material;
   a first electrically conductive via formed in the core material, the first electrically conductive via comprising:
      a top layer portion disposed on the top outer surface of the core material,
      a bottom layer portion disposed on the bottom outer surface of the core material,
      and a vertical portion through the core material connecting the top layer portion and the bottom layer portion;
   a second electrically conductive via formed in the core material, coaxial with the first electrically conductive via and separated from the first electrically conductive via by a non-conductive material extending from the first electrically conductive via to the second electrically conductive via;
   a first conductive element disposed on the top layer portion of the first electrically conductive via, the first conductive element extending through the at least one additional layer adjacent the core material; and
   a second conductive element disposed on a top end of the second electrically conductive via, the second conductive element extending through the at least one additional layer adjacent the core material.

2. The laminate interconnect structure of claim 1, wherein the first electrically conductive via and the second electrically conductive via are adapted to convey electrical power and electrical ground.

3. The laminate interconnect structure of claim 1, wherein the first electrically conductive via and the second electrically conductive via are adapted to convey signal power and signal ground.

4. The laminate interconnect structure of claim 1, further comprising a third electrically conductive via formed coaxial with the first electrically conductive via and the second electrically conductive coaxial via in the core material and separated from the first electrically conductive via and the second electrically conductive via by the non-conductive material.

5. The laminate interconnect structure of claim 4, wherein the second electrically conductive via and the third electrically conductive via are adapted to convey a differential signal.

6. The laminate interconnect structure of claim 5, wherein each of the first electrically conductive via, second electrically conductive via and third electrically conductive via are separated and electrically isolated by the non-conductive material.

7. An integrated circuit package, comprising:
   a printed circuit board;
   a circuit package, the circuit package having a laminate interconnect structure on which an integrated circuit chip is located, the laminate interconnect structure having a core material and at least one additional layer adjacent the core material, the laminate interconnect structure having at least one coaxial via formed therein, the coaxial via providing two electrical paths through the laminate interconnect structure to the integrated circuit chip.

8. The integrated circuit package of claim 7, wherein the coaxial via further comprises:
   a first electrically conductive via formed in the core material, the first electrically conductive via comprising:
      a top layer portion disposed on a top outer surface of the core material,
      a bottom layer portion disposed on a bottom outer surface of the core material,
      and a vertical portion through the core material connecting the top layer portion and the bottom layer portion; and
   a second electrically conductive via formed in the core material, coaxial with the first electrically conductive via and separated from the first electrically conductive via by a non-conductive material.

9. The integrated circuit package of claim 8, wherein the first electrically conductive via and the second electrically conductive via are adapted to convey electrical power and electrical ground.

10. The integrated circuit package of claim 8, wherein the first electrically conductive via and the second electrically conductive via are adapted to convey signal power an signal ground.

11. The integrated circuit package of claim 8, further comprising a third electrically conductive via formed coaxial with the first electrically conductive via and the third electrically conductive coaxial via in the core material and separated from the first electrically conductive via and the third electrically conductive via by the non-conductive material.

12. The integrated circuit package of claim 11, wherein the second electrically conductive via and the third electrically conductive via are adapted to convey a differential signal.

13. The integrated circuit package of claim 12, wherein each of the first electrically conductive via, second electrically conductive via and third electrically conductive via are separated and electrically isolated by the non-conductive material.

14. The integrated circuit package of claim 8, wherein the top layer portion of the first electrically conductive via is disposed on the top outer surface of the core material between the core material and the at least one additional layer adjacent the core material.

15. The integrated circuit package of claim 14, further comprising:
a first conductive element disposed on the top layer portion of the first electrically conductive via, the first conductive element extending through the at least one additional layer adjacent the core material; and
a second conductive element disposed on a top end of the second electrically conductive via, the second conductive element extending through the at least one additional layer adjacent the core material.

16. The integrated circuit package of claim 14, wherein the bottom layer portion of the first electrically conductive via is disposed on the bottom outer surface of the core material between the core material and a second additional layer adjacent the core material.

17. The laminate interconnect structure of claim 1, wherein the top layer portion of the first electrically conductive via is disposed on the top outer surface of the core material between the core material and the at least one additional layer adjacent the core material.

18. The laminate interconnect structure of claim 17, wherein the top layer portion of the first electrically conductive via is formed by plating.

19. The laminate interconnect structure of claim 17, wherein the bottom layer portion of the first electrically conductive via is disposed on the bottom outer surface of the core material between the core material and a second additional layer adjacent the core material.

20. The laminate interconnect structure of claim 19, further comprising:
a third conductive element disposed on the bottom layer portion of the first electrically conductive via, the third conductive element extending through the second additional layer adjacent the core material; and
a fourth conductive element disposed on a bottom end of the second electrically conductive via, the fourth conductive element extending through the second additional layer adjacent the core material.

* * * * *